US009645178B2

(12) United States Patent
Chun et al.

(10) Patent No.: US 9,645,178 B2
(45) Date of Patent: May 9, 2017

(54) SYSTEM AND METHOD FOR ESTIMATING CURRENT IN DC-DC CONVERTER

(71) Applicant: Hyundai Motor Company, Seoul (KR)

(72) Inventors: Shin Hye Chun, Jeollanam-do (KR); Dong Jun Lee, Incheon (KR)

(73) Assignee: Hyundai Motor Company, Seoul (KR)

( * ) Notice: Subject to any disclaimer, the term of this patent is extended or adjusted under 35 U.S.C. 154(b) by 809 days.

(21) Appl. No.: 14/059,952

(22) Filed: Oct. 22, 2013

(65) Prior Publication Data

US 2014/0358461 A1 Dec. 4, 2014

(30) Foreign Application Priority Data

May 30, 2013 (KR) ........................ 10-2013-0061813

(51) Int. Cl.
*G01R 19/00* (2006.01)
*G01R 31/40* (2014.01)
*H02M 1/00* (2006.01)

(52) U.S. Cl.
CPC .......... *G01R 19/0092* (2013.01); *G01R 31/40* (2013.01); *H02M 2001/0009* (2013.01)

(58) Field of Classification Search
CPC .................................................. G01R 19/0092
USPC .......................................................... 702/64
See application file for complete search history.

(56) References Cited

U.S. PATENT DOCUMENTS

| | | | |
|---|---|---|---|
| 2002/0126517 A1* | 9/2002 | Matsukawa | H02M 3/33569 363/69 |
| 2012/0146545 A1 | 6/2012 | Nerone | |
| 2013/0051084 A1* | 2/2013 | Hachiya | H02M 3/33507 363/21.01 |

FOREIGN PATENT DOCUMENTS

| | | |
|---|---|---|
| JP | 2011091960 A | 5/2011 |
| JP | 2011205727 | 10/2011 |
| JP | 2011-223701 A | 11/2011 |
| JP | 2012060723 A | 3/2012 |
| JP | 2012060819 A | 3/2012 |
| JP | 2012090406 A | 5/2012 |
| JP | 2012249351 A | 12/2012 |
| KR | 10-0975925 | 2/2010 |

* cited by examiner

*Primary Examiner* — Bryan Bui
(74) *Attorney, Agent, or Firm* — Mintz Levin Cohn Ferris Glovsky and Popeo, P.C.; Peter F. Corless

(57) ABSTRACT

A system and method for estimating current in a DC-DC converter are provided that estimate an output current of the DC-DC converter more accurately by correcting an output voltage of a CT sensor at an input terminal as a part of a current map and an efficiency map. The current map and the efficiency map are configured in a 2D form, since the output voltage of the CT sensor varies depending on the PWM duty.

15 Claims, 12 Drawing Sheets

Output current estimation logic

*Values in table are current estimation values monitored

| Measured output current (A) | Input voltage A | | | Input voltage B | | | Input voltage C | | |
| --- | --- | --- | --- | --- | --- | --- | --- | --- | --- |
| | Output voltage1 | Output voltage2 | Output voltage3 | Output voltage1 | Output voltage2 | Output voltage3 | Output voltage1 | Output voltage2 | Output voltage3 |
| 10 | 8 | 8 | 8 | 8 | 9 | 9 | 8 | 9 | 9 |
| 20 | 19 | 19 | 19 | 17 | 18 | 19 | 17 | 18 | 19 |
| 30 | 28 | 29 | 29 | 27 | 28 | 29 | 26 | 28 | 29 |
| 40 | 38 | 39 | 40 | 36 | 37 | 39 | 35 | 37 | 39 |
| 50 | 48 | 49 | 50 | 45 | 47 | 49 | 45 | 47 | 49 |
| 60 | 58 | 59 | 60 | 55 | 57 | 60 | 54 | 57 | 59 |
| 70 | 68 | 69 | 70 | 65 | 67 | 70 | 63 | 67 | 70 |
| 80 | 80 | 79 | 80 | 75 | 78 | 80 | 75 | 77 | 80 |
| 90 | 88 | 90 | 91 | 86 | 88 | 90 | 84 | 87 | 91 |
| 100 | 99 | 99 | 100 | 94 | 97 | 101 | 95 | 98 | 101 |
| 110 | 109 | 109 | 111 | 104 | 107 | 110 | 105 | 107 | 110 |
| 120 | 119 | 119 | 121 | 117 | 118 | 120 | 115 | 118 | 120 |
| 130 | 130 | 129 | 129 | 129 | 130 | 132 | 127 | 129 | 131 |
| 135 | 135 | 134 | 133 | 134 | 135 | 137 | 134 | 134 | 136 |
| 140 | 140 | 138 | 138 | 140 | 140 | 141 | 139 | 140 | 142 |

FIG. 10

|  | Input terminal current sensor | Output terminal current sensor |
|---|---|---|
| Sensory type | Magnetic induction | Current magnetic effect |
| Response | Fast | Slow |
| Error rate | High (non-linear) | Low |
| Price | Low | High |
| Purpose of use | Input terminal over-current fault detection | Output over-current fault detection, Current limit control, Power monitoring, Extremely low load on/off control |

FIG. 15

RELATED ART

SYSTEM AND METHOD FOR ESTIMATING CURRENT IN DC-DC CONVERTER

CROSS-REFERENCE TO RELATED APPLICATION

This application claims under 35 U.S.C. §119(a) the benefit of Korean Patent Application No. 10-2013-0061813 filed May 30, 2013, the entire contents of which are incorporated herein by reference.

BACKGROUND (a) Technical Field

The present invention relates to a system and method for estimating current in a direct current to direct current (DC-DC) converter. More particularly, the present invention relates to an output terminal current estimation logic for a DC-DC converter for a vehicle.

(b) Background Art

FIG. 14 is an exemplary diagram showing the structure of a conventional DC-DC converter for a vehicle and the position of a current sensor. The conventional DC-DC converter includes a current sensor 10 that senses current at an output terminal and a current transformer (CT) sensor 20 that senses current at an input terminal. The current sensor 10 at the input terminal performs the following operations:

(1) In the event of an over-current, the current sensor 10 detects the over-current and performs a protective function;

(2) In the event of an over-temperature, the current sensor 10 performs a protective function through output current limit control;

(3) The current sensor 10 calculates power consumption at a high voltage input of a DC-DC converter for high voltage power distribution of a controller in a vehicle; and (4) In the event of an extremely low load, the current sensor 10 performs output on/off control (e.g., determines mode entry and exit conditions).

Moreover, the CT sensor 20 that senses the current at the input side performs fast fault detection in the event of a short circuit at the input terminal, such as an arm short-circuit, and detects a current unbalance at the secondary (output) side.

FIG. 15 is an exemplary table showing the difference between an input terminal current sensor and an output terminal current sensor. As shown in FIG. 15, the conventional DC-DC converter for a vehicle includes different types of current sensors configured to perform the above-described two purposes. However, since the conventional DC-DC converter includes different types of current sensors that perform the current measurement, cost or circuit size increases.

The above information disclosed in this section is only for enhancement of understanding of the background of the invention and therefore it may contain information that does not form the prior art that is already known in this country to a person of ordinary skill in the art.

SUMMARY

The present invention provides a current estimation system and method which may perform the function of an existing output terminal current sensor using a current transformer (CT) sensor applied to an output terminal without the use of the output terminal current sensor.

In one aspect, the present invention provides a system and method for estimating an output current of a direct current to direct current (DC-DC) converter, the method may include: correcting an output voltage of a current transformer (CT) sensor based on an output voltage of the DC-DC converter; calculating an input current value of the DC-DC converter in a current map using the corrected output voltage of the CT sensor; and calculating the efficiency of the DC-DC converter in an efficiency map using the input current value.

In an exemplary embodiment, in correcting the output voltage of the CT sensor based on the output voltage of the DC-DC converter, the output voltage of the CT sensor may be corrected to be equal to an output voltage value of a CT sensor at a pre-stored output voltage of the DC-DC converter.

In another exemplary embodiment, in calculating the input current value using the corrected output voltage of the CT sensor, a current value that corresponds to the corrected output voltage of the CT sensor in the current map and the input voltage of the DC-DC converter may be calculated as the input current value.

In still another exemplary embodiment, in calculating the efficiency of the DC-DC converter in the efficiency map using the input current value, the efficiency that depends on the input current value and the input voltage value of the DC-DC converter may be selected.

In yet another exemplary embodiment, after calculating the efficiency of the DC-DC converter in the efficiency map using the input current value, the efficiency for each output voltage may be corrected using the efficiency, an output power may be calculated based on the corrected efficiency for each output voltage, and an output current may be calculated based on the output power.

In still yet another exemplary embodiment, before correcting the output voltage of the CT sensor based on the output voltage of the DC-DC converter, an output voltage of a CT sensor of the DC-DC converter may be adjusted into a direct current waveform using a low pass filter, an input power value may be calculated by multiplying the adjusted output voltage of the CT sensor by the input voltage of the DC-DC converter, an output power value may be calculated by multiplying the input power value by the efficiency of the output power which depends on the input voltage, and an output current may be calculated by dividing the output power value by the output voltage of the DC-DC converter.

BRIEF DESCRIPTION OF THE DRAWINGS

The above and other features of the present invention will now be described in detail with reference to exemplary embodiments thereof illustrated the accompanying drawings which are given hereinbelow by way of illustration only, and thus are not limitative of the present invention, and wherein:

FIG. 10 is an exemplary comparison table of measured output currents and monitored current estimation values of the converter according to an exemplary embodiment of the present invention;

FIG. 15 is an exemplary table showing the difference between an input terminal current sensor and an output terminal current sensor according to the related art.

Figure 1:
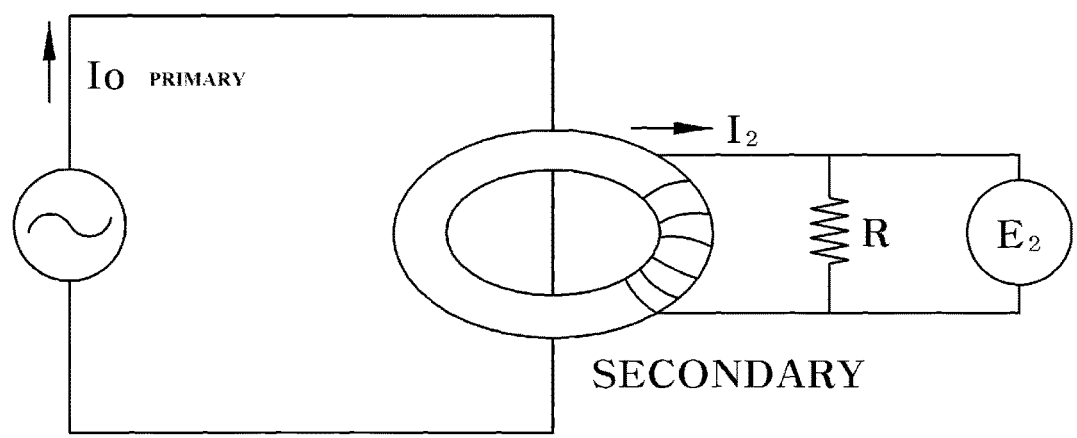
FIG. 1 is an exemplary diagram showing a method for measuring an output voltage using a CT sensor according to an exemplary embodiment of the present invention.

Reference numerals set forth in the Drawings includes reference to the following elements as further discussed below:

| | |
|---|---|
| 10: current sensor | 20: CT sensor |
| 100: CT sensor | 200: low pass filter |
| 300: processor | 310: input power value |
| 320: efficiency map | 330: low pass filter |

It should be understood that the accompanying drawings are not necessarily to scale, presenting a somewhat simplified representation of various exemplary features illustrative of the basic principles of the invention. The specific design features of the present invention as disclosed herein, including, for example, specific dimensions, orientations, locations, and shapes will be determined in part by the particular intended application and use environment. In the figures, reference numbers refer to the same or equivalent parts of the present invention throughout the several figures of the drawing.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g., fuels derived from resources other than petroleum).

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter reference will now be made in detail to various exemplary embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

FIG. 1 is an exemplary diagram showing a method for measuring an output voltage using a CT sensor. A current transformer (CT) sensor may be configured to measure the amount of current using a secondary side current that is proportional to a primary current using a current transformer. The voltage may be measured by connecting a resistor (R) to the output of this sensor. In other words, the output voltage of the CT sensor may be represented by the following equation:

$$CT \text{ Output voltage}(E_2) = \text{Primary current}(I_0) \times \frac{1}{\text{Turn ratio}} \times R$$

Figure 2:
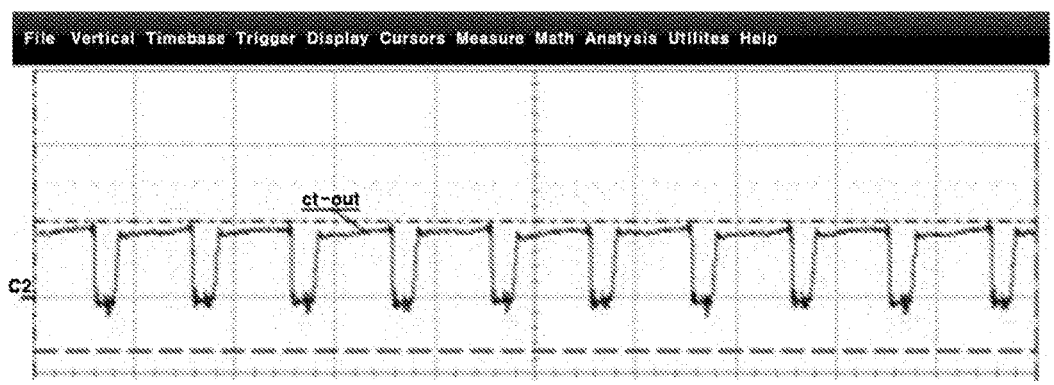
FIG. 2 is an exemplary graph showing waveforms of output voltages of a CT sensor with respect to the same primary current according to an exemplary embodiment of the present invention.
Figure 2:
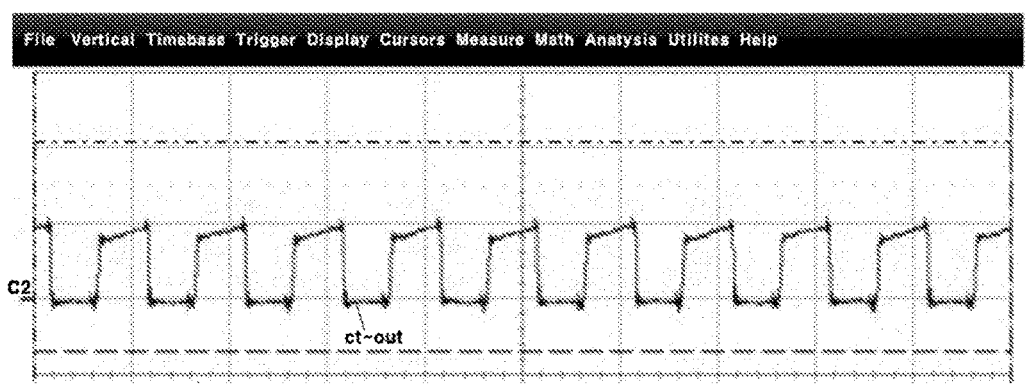

FIG. 2 is an exemplary graph showing waveforms of output voltages of a CT sensor with respect to the same primary current. Even at the same primary current, the pulse widths and gradients of the output voltages of the CT sensor may be different since the duties that determine the input/output voltage relationship may be different, and thus the output voltage may have non-linear characteristics with respect to the magnitude of the primary current (absolute value). Therefore, it may be necessary to sense the input current using a current map including the difference in the output of the CT sensor, which may depend on the input voltage, and the non-linearity that depends on the current based on these characteristics.

For the same reason, the average value of the outputs of the CT sensor may vary depending on the output voltage, and thus the outputs of the CT sensor may be corrected. In particular, a DC-DC converter of a vehicle, that controls the output voltage, may have consistent output current estimation values over the entire output voltage control area regardless of the output voltage.

Figure 3:
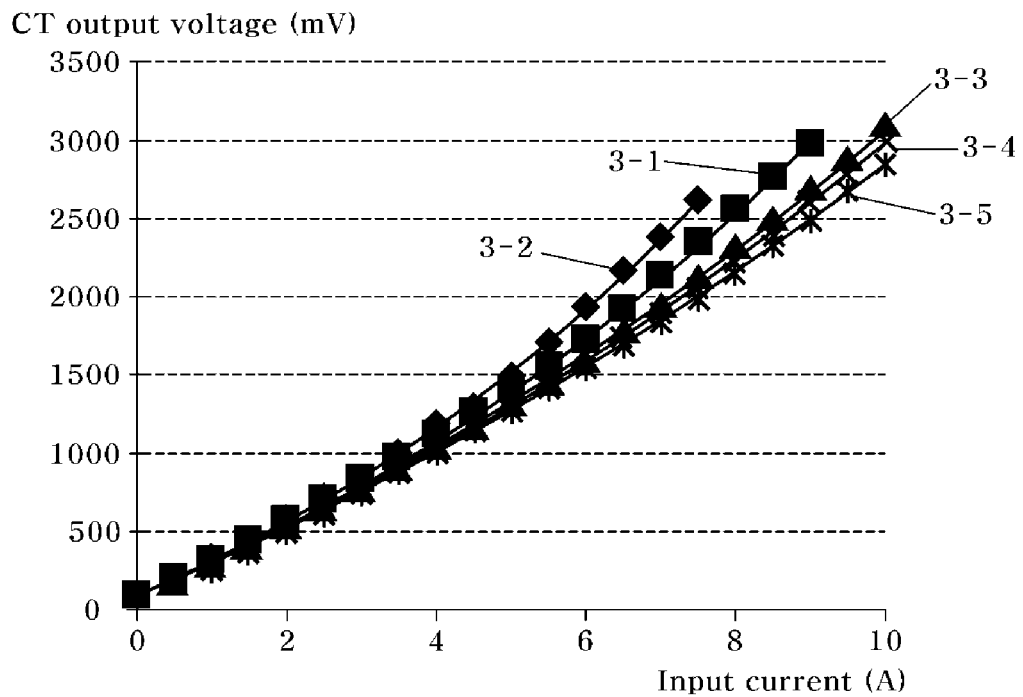
FIG. 3 is an exemplary graph showing output characteristics of a CT sensor for each input current according to an exemplary embodiment of the present invention.

FIG. 3 is an exemplary graph showing output characteristics of a CT sensor for each input current, which shows different output voltages with respect to the same input voltage. In FIG. 3, 3-1 is a reference output voltage graph. In other words, 3-1 is an exemplary graph that shows the most ideal output voltage depending on the input voltage through repeated experiments. The most ideal output voltage may be referred to as a reference voltage. The reference voltage value may be pre-stored in the DC-DC converter and used in a subsequent correction step. Further, 3-2 is an exemplary graph in which the output voltage is higher than the reference voltage with respect to the same input voltage, and 3-3, 3-4 and 3-5 are exemplary graphs in which the output voltage is lower than the reference voltage.

Figure 4:
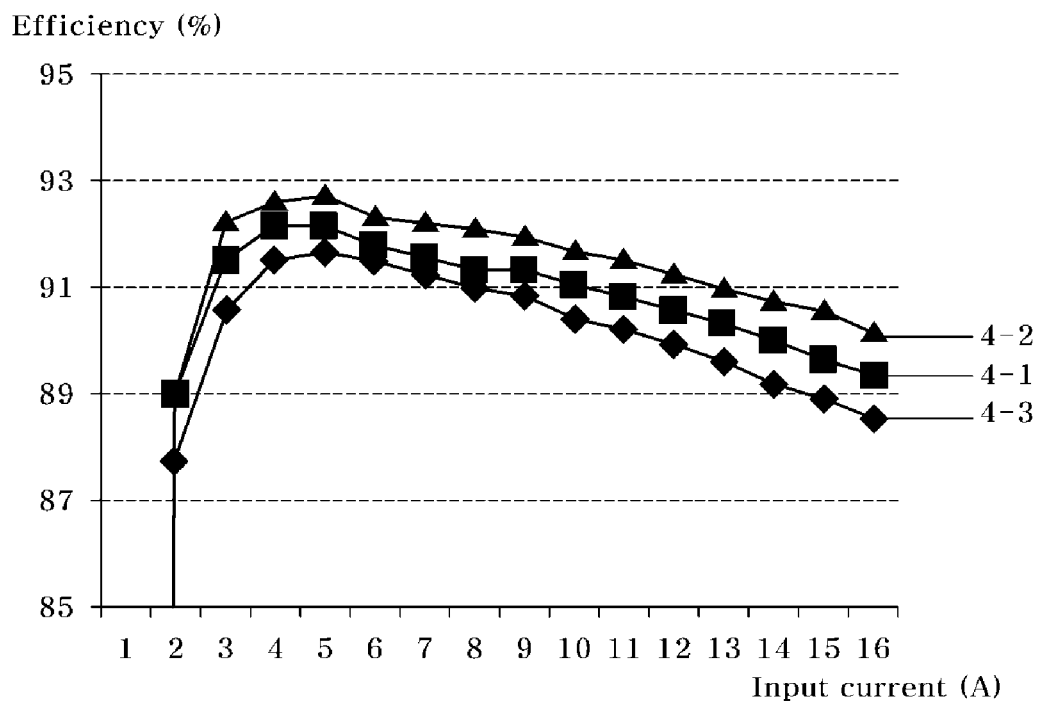
FIG. 4 is an exemplary graph showing the efficiency of a CT sensor for each input current with respect to different output voltages relative to the same input voltage according to an exemplary embodiment of the present invention.

FIG. 4 is an exemplary graph showing the efficiency of a CT sensor for each input current with respect to different output voltages relative to the same input voltage. In FIG. 4, 4-1 is an exemplary graph that shows the efficiency of the CT sensor at the most ideal output voltage measured through repeated experiments, i.e., at the reference voltage. Further, 4-2 is an exemplary graph that shows the efficiency of the CT sensor at a higher output voltage, and 4-3 is an exemplary graph that shows the efficiency of the CT sensor at a lower output voltage.

The output voltage at an output terminal and the efficiency of the output voltage may be different even at the same input voltage since the pulse widths and gradients of the output voltage waveforms of the CT may be different even at the same voltage as described above. Therefore, the output voltage of the CT sensor may be corrected.

Figure 5:
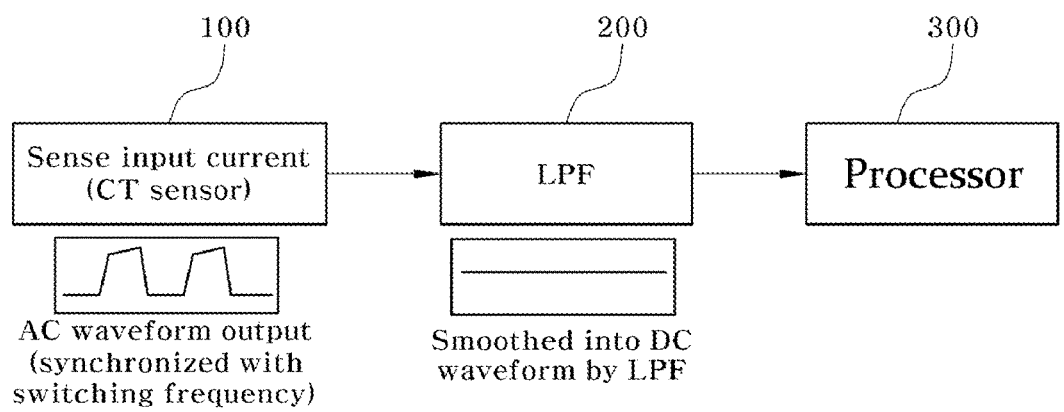
FIG. 5 is an exemplary diagram showing a method for estimating an output current using a CT sensor according to an exemplary embodiment of the present invention.

FIG. 5 is an exemplary diagram showing a method for estimating an output current using a CT sensor. The output current estimation logic in accordance with an exemplary embodiment of the present invention may include a CT sensor 100, a low pass filter (LPF) 200, and a processor 300.

Figure 6:
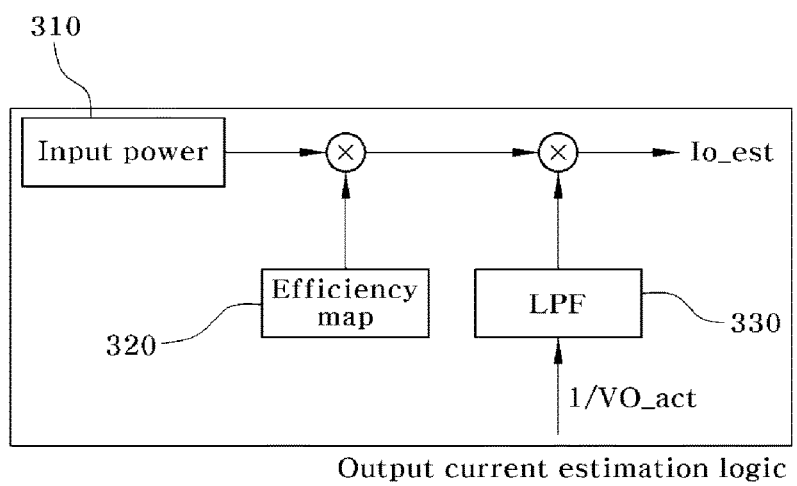
FIG. 6 is an exemplary block diagram showing a process of calculating an output current, performed in a processor, according to an exemplary embodiment of the present invention.

The CT sensor 100 at an input terminal may be configured to send out an output of an alternating current waveform. To estimate the output current using the CT sensor 100 at the input terminal of the DC-DC converter, a process of adjusting the output of the alternating current waveform may be performed at a constant frequency using the low pass filter 200. In particular, the time constant of the low pass filter 200 may be designed to cause the signal to be sufficiently adjusted and to not affect the current limit control even in the event of a rapid change in load at the output terminal FIG. 6 is an exemplary block diagram showing a process of calculating an output current, performed in a processor. The sensed voltage that has passed through the low pass filter 200 may be input to the processor 300 and may be multiplied by a sensed input voltage value of the DC-DC converter, thus obtaining an input power value 310. The input power value 310 may be multiplied by an efficiency map 320 to calculate an output power value. The efficiency map 320 may be obtained by measuring the output voltage depending on the input voltage of the DC-DC converter. Additionally, the output power value may be divided by a sensed output voltage again to obtain the final output current.

The sensed output voltage may be used to divide the output power value after passing through the low pass filter 330. However, the error level of the calculated final output current estimation value may vary depending on the accuracy of calculation coefficients such as input/output conditions or efficiency map. Therefore, it may be necessary to further use correction logic to solve the errors.

Figure 7:
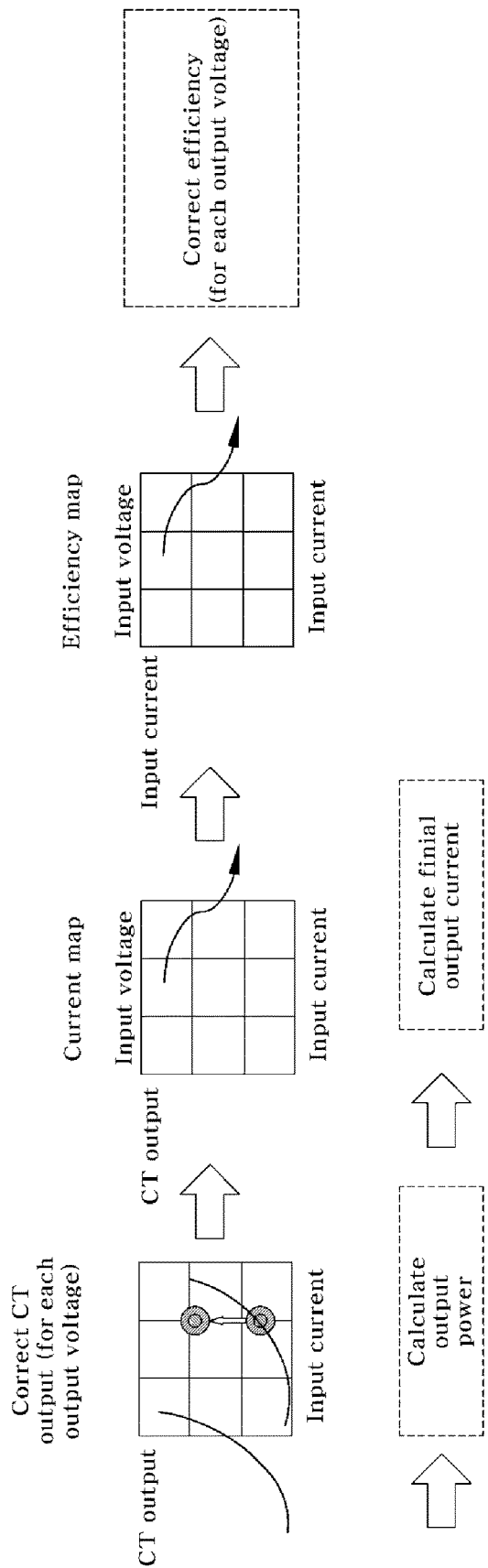
FIG. 7 is an exemplary diagram showing logic for correcting the final output current of a DC-DC converter according to an exemplary embodiment of the present invention.

FIG. 7 is an exemplary diagram showing logic for correcting the final output current of a DC-DC converter. First, the output voltage of the CT sensor may be corrected depending on the output voltage of the DC-DC converter. In other words, the difference in the output of the CT sensor 100 that depends on the output voltage may be pre-corrected, allowing the output voltage to be omitted in a subsequent current map.

Figure 8:
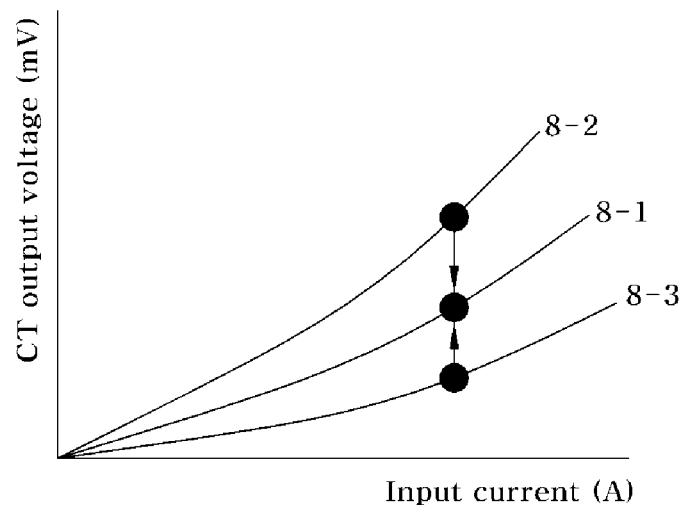
FIG. 8 is an exemplary graph showing a method for pre-correcting an output voltage of a CT sensor according to an output voltage of a DC-DC converter according to an exemplary embodiment of the present invention.

The pre-correction method is shown in FIG. 8. The method for correcting the difference in the output of the CT sensor 100 that depends on the output voltage may be performed by extracting data that depends on the output of the CT sensor 100, which may vary depending on the output voltage for each load, based on a reference output voltage and then determining a curve fitting function with a polynomial representation. The curve fitting refers to a process of constructing a curve or equation that is the most appropriate for a set of data points. In other words, the output of the CT sensor 100 may be corrected to be equal to a reference output voltage value (S) with respect to any output voltage, and then the value may be set to a map.

With the above-described correction method, the output of the CT sensor 100 that depends on the output voltage may be corrected without the use of a complex 3D map. An input current value may be calculated using a current map in the next step based on the corrected output value of the CT sensor 100.

The current map is a map that stores the relationship between the input voltage and input current of the DC-DC converter and the output voltage of the CT sensor 100. The current map may be configured as a map in which the input voltage that depends on the output voltage of the CT sensor 100 and the corresponding input current may be measured for each of various loads and may be pre-stored. The input current that depends on the corrected output value of the CT sensor 100 and the sensed input value of the DC-DC converter may be calculated based on the current map.

The calculated input current value may be input to an efficiency map and used to calculate the current efficiency of the DC-DC converter. In other words, the method for correcting the difference in the efficiency for each output voltage may be achieved by finding the efficiency that depends on the efficiency map depending on the input current and voltage and then correcting the efficiency based on the final output voltage.

Figure 9:
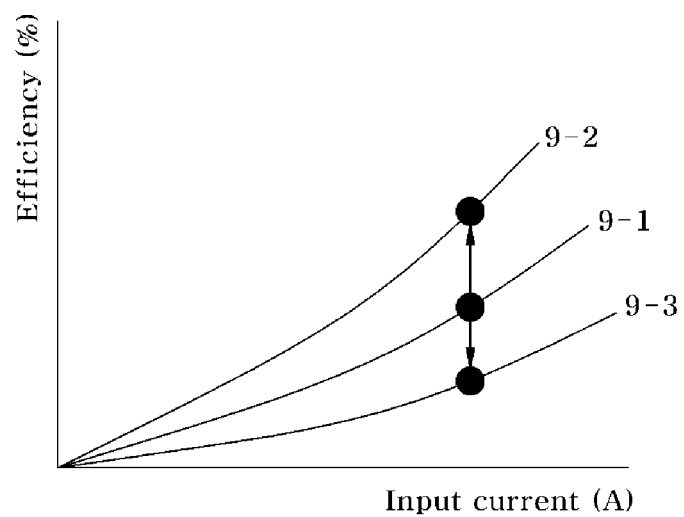
FIG. 9 is an exemplary graph showing a method for correcting an efficiency value on an efficiency map by extracting data depending on output voltages and obtaining a correction function according to an exemplary embodiment of the present invention.

FIG. 9 is an exemplary graph showing a method for correcting an efficiency value on an efficiency map by extracting data depending on output voltages and obtaining a correction function. In other words, the correction on the efficiency for each output voltage may be performed by selecting a reference output voltage, extracting efficiency data with respect to the voltage, writing a map with the efficiency data, and obtaining a final efficiency value by applying the curve fitting correction function to the fed-back output terminal voltage.

When the efficiency for each output voltage is corrected in the above manner, the output power of the DC-DC converter may be obtained. Then, when the difference in the output of the CT sensor 100 is removed and when the output power of the DC-DC converter is divided by the output voltage which has been corrected as the most optimal value based on the current map and the efficiency map, the final output current may be obtained. Accordingly, the output current of the DC-DC converter may be calculated using the CT sensor 100 at the input terminal without the use of the output terminal current sensor.

EXAMPLE

FIG. 10 is an exemplary comparison table of measured output currents and monitored current estimation values of the converter. As a result of monitoring the estimation currents by combining the conditions for each output voltage depending on the input voltage (e.g., effect of difference in duty), the estimation currents fell within a design tolerance (e.g., about ±5%) over the entire area without being significantly affected by the conditions. Based on the result, the correction effect of the current estimation logic over the entire converter control area was confirmed.

For reference, the above-described effect is the same as the current error tolerance when the output current sensor is used.

Figure 11:
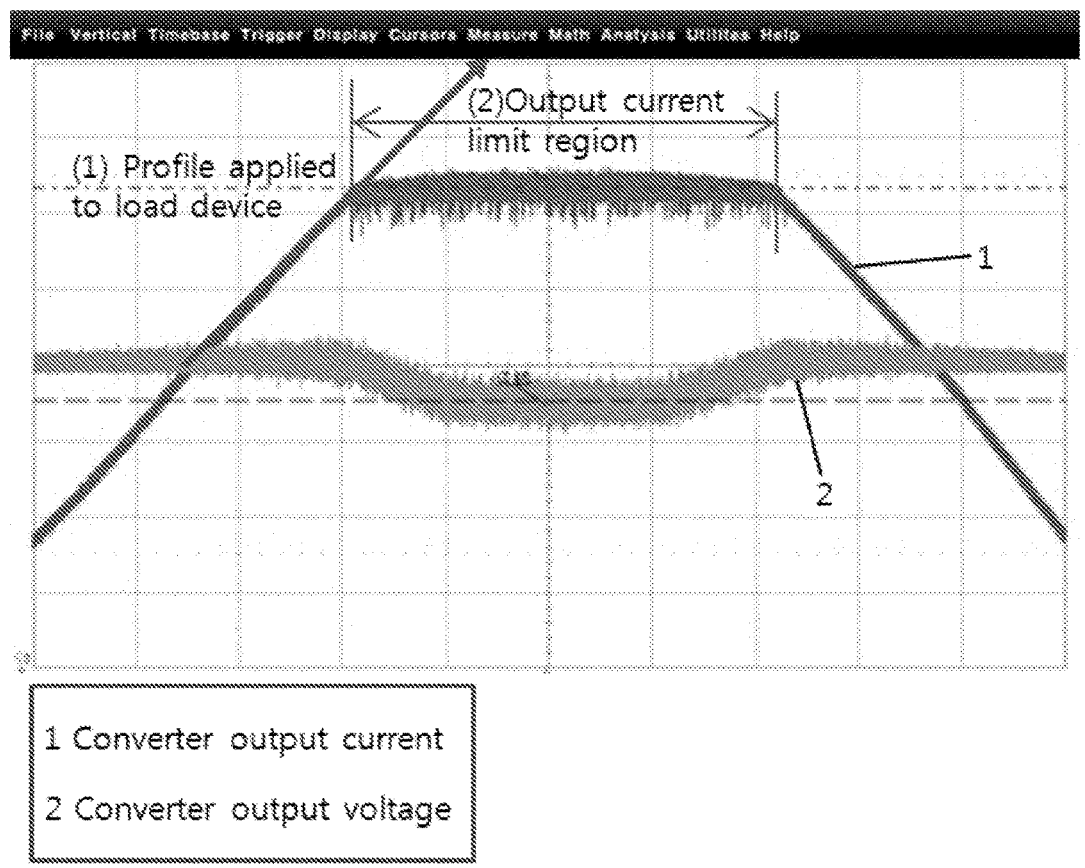
FIG. 11 is an exemplary graph showing that the waveform of an output current is limited by output limit control performed on a converter when the current level of a load device increases to an over-current level at a constant gradient according to an exemplary embodiment of the present invention.

FIG. 11 is an exemplary graph showing that the waveform of an output current is limited in region (2) by output limit control performed on a converter when the current level of a load device increases to an over-current level at a constant gradient with profile (1). This shows that the output current may be estimated within the design tolerance and controlled to fit the output current limit reference value. When the current is not limited, the current required for a load may be continuously increased (e.g., output) as shown in the arrow of (1).

Figure 12:
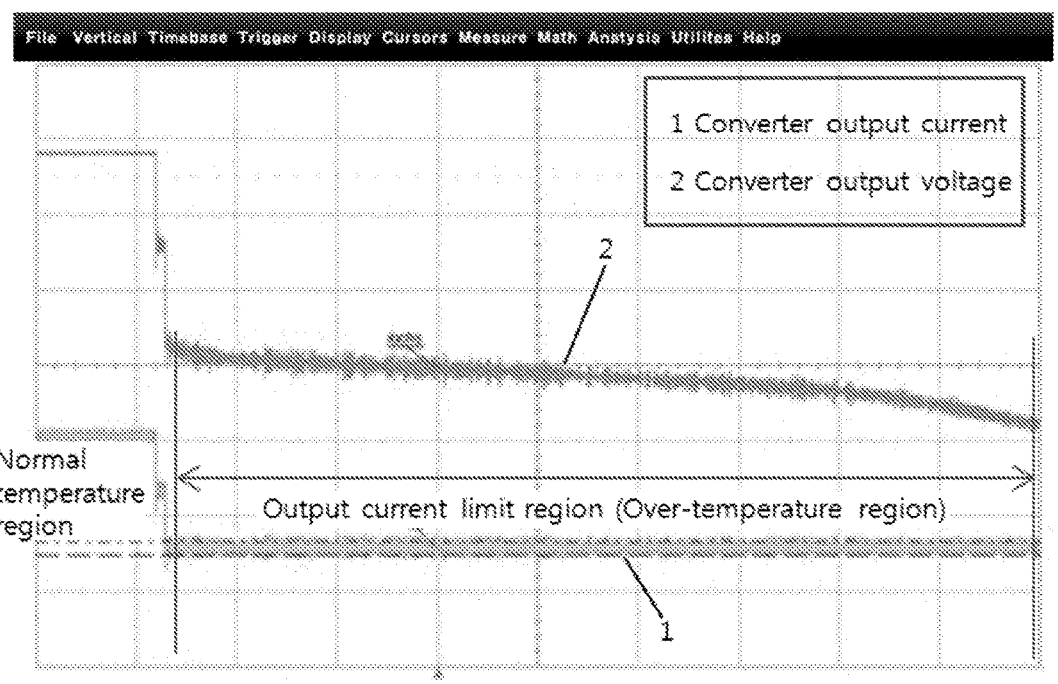
FIG. 12 is an exemplary graph showing waveforms after performing a current limit function for over-temperature protection when an over-temperature of a converter is simulated according to an exemplary embodiment of the present invention.

FIG. 12 is an exemplary graph showing waveforms after performing a current limit function over-temperature protection when an over-temperature of a converter is simulated. The output current may be supplied in a quantity as required by a load in a normal temperature region (e.g., a temperature region in which the parts such as the diode and power module are not overheated and operate without failure), and the current may be limited in an over-temperature mode. Therefore, the current as a limit value for temperature drop (e.g., cooling) was limited by the output current estimation function.

Figure 13:
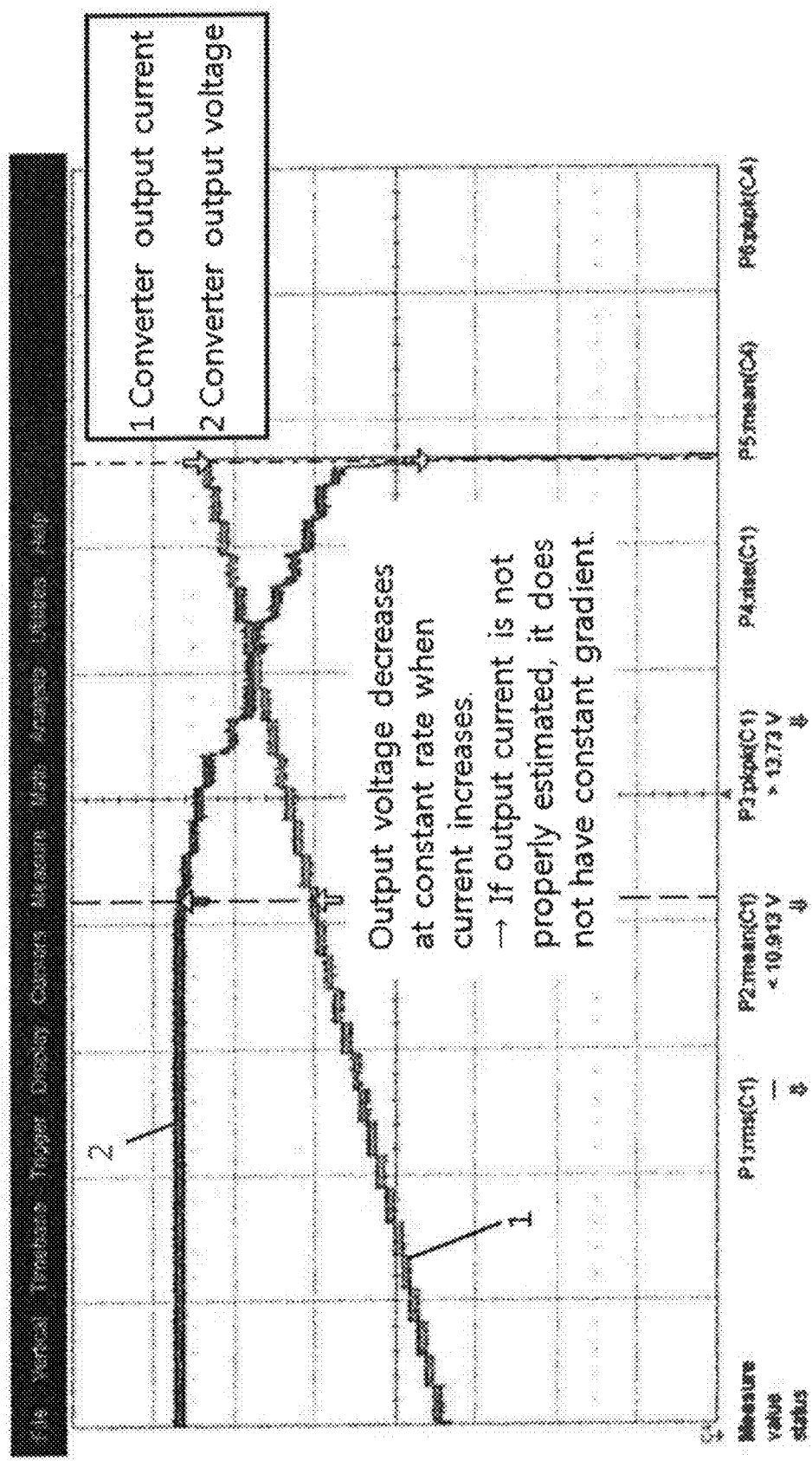
FIG. 13 is an exemplary graph showing a logic in which the output voltage is reduced at a constant rate in an inverse proportion to the output current that increases at a constant rate when a current limit function for protection during over-current and over-temperature is performed according to an exemplary embodiment of the present invention.
Figure 14:
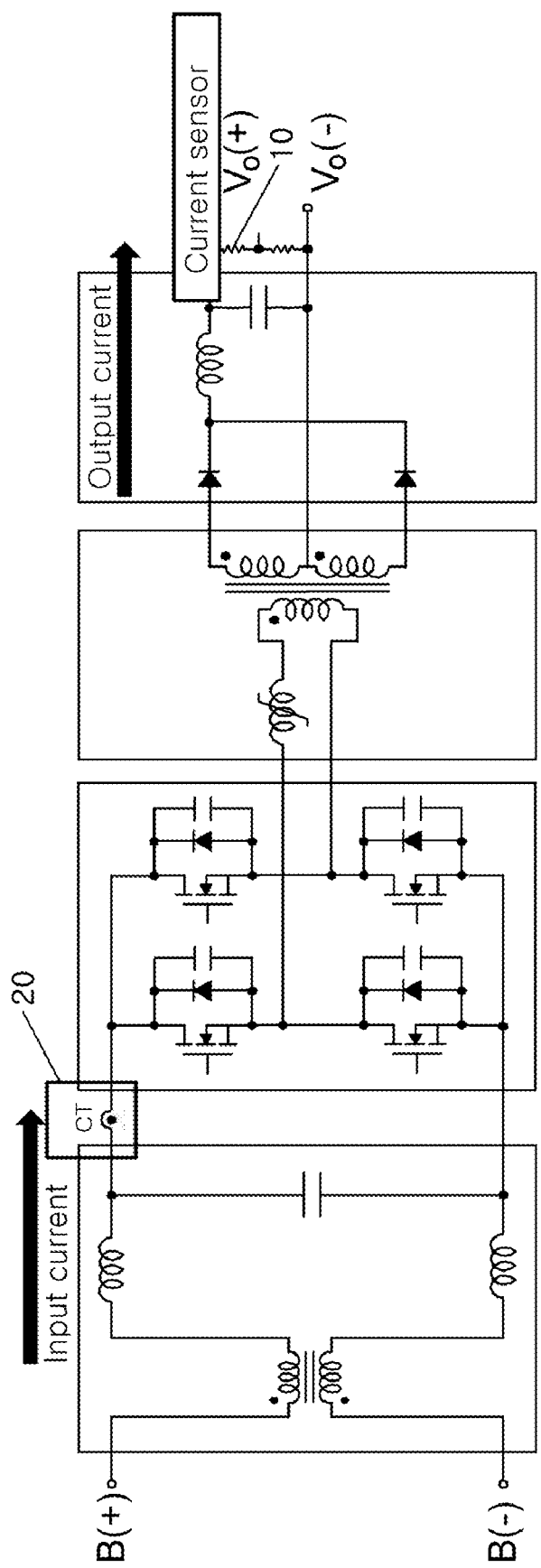
FIG. 14 is an exemplary diagram showing the structure of a conventional DC-DC converter for a vehicle and the position of a current sensor according to the related art.

FIG. 13 is an exemplary graph showing a logic in which the output voltage is reduced at a constant rate in an inverse proportion to the output current that increases at a constant rate when a current limit function for protection during over-current and over-temperature is performed. When the output current estimation is not properly performed at a current level to be limited, the gradient waveform at a constant rate may not be obtained (which may rapidly or slowly decrease compared to the design gradient). However, based on the results of the above waveforms, the current estimation was properly performed.

As a result of applying the output current estimation logic using the values sensed by the input current sensor, the output current estimation values fell within the error rate of about ±5% over the range of rating power as shown in FIG. 10. Thus, the validity for the proposed current estimation logic has been confirmed and, when the current limit control during over-current and over-temperature using the estimated currents was performed, the output current at a desired level may be limited with minimal overshoot due to a delay in control response as shown in FIGS. 11, 12 and 13. Therefore, the filter time constant of the output of the input current sensor (e.g., CT sensor) and the estimation logic cycle of software were selected to meet the requirements, the estimation of the output current according to the increase in the output current was achieved, and thus the limit function of the output voltage was properly performed.

As described above, the DC-DC converter current estimation logic according to the present invention has the following effects.

First, the current of the output terminal may be determined with the use of the CT sensor at the input terminal.

Second, the current sensor at the output terminal may be eliminated, thus reducing the cost of the system.

Third, the size of the DC-DC converter may be reduced.

Fourth, it may not be necessary to use a complex 3D map with respect to the output of the CT sensor that depends on the output voltage, and thus it may be possible to reduce the amount of calculation performed by the processor for the current estimation logic, thus reducing the load factor.

Fifth, it may be possible to correct the output of the CT sensor according to the duty through a simple polynomial representation.

Sixth, it may be possible to reduce the estimation (e.g., sensing) errors.

Seventh, it may be possible to immediately calculate the input power, thus improving the accuracy of power monitoring.

The invention has been described in detail with reference to exemplary embodiments thereof. However, it will be appreciated by those skilled in the art that changes may be made in these embodiments without departing from the principles and spirit of the invention, the scope of which is defined in the accompanying claims and their equivalents.

What is claimed is:

1. A method for estimating an output current of a direct current to direct current (DC-DC) converter, the method comprising:

correcting, by a processor, an output voltage of a current transformer (CT) sensor to be about equal to an output voltage value of a CT sensor at a pre-stored output voltage of the DC-DC converter, the current transformer (CT) sensor being applied to an input terminal of the DC-DC converter to sense current at the input terminal of the DC-DC converter;

calculating, by the processor, an input current value of the DC-DC converter in a current map using the corrected output voltage of the CT sensor wherein the current map is a map that stores the relationship between the input voltage and input current of the DC-DC converter and the output voltage of the CT sensor; and calculating, by the processor, the efficiency of the DC-DC converter in an efficiency map using the input current value wherein the efficiency map is obtained by previously and experimentally measuring the output voltage depending on the input voltage of the DC-DC converter.

2. The method of claim 1, wherein in calculating the input current value using the corrected output voltage of the CT sensor, a current value that corresponds to the corrected output voltage of the CT sensor in the current map and the input voltage of the DC-DC converter is calculated as the input current value.

3. The method of claim 1, wherein in calculating the efficiency of the DC-DC converter in the efficiency map using the input current value, the efficiency that depends on the input current value and the input voltage value of the DC-DC converter is selected.

4. The method of claim 1, further comprising:
correcting, by the processor, the efficiency for each output voltage using the efficiency;
calculating, by the processor, an output power based on the corrected efficiency for each output voltage; and
calculating, by the processor, an output current based on the output power.

5. The method of claim 1, further comprising:
adjusting, by the processor, an output voltage of a CT sensor of the DC-DC converter into a direct current waveform using a low pass filter prior to correcting the output voltage of the CT sensor;
calculating, by the processor, an input power value by multiplying the adjusted output voltage of the CT sensor by the input voltage of the DC-DC converter;
calculating, by the processor, an output power value by multiplying the input power value by the efficiency of the output power which depends on the input voltage; and
calculating, by the processor, an output current by dividing the output power value by the output voltage of the DC-DC converter.

6. A system for estimating an output current of a direct current to direct current (DC-DC) converter, the system comprising:
a direct current to direct current (DC-DC) converter;
a current transformer (CT) sensor being applied to an input terminal of the DC-DC converter to sense current at the input terminal of the DC-DC converter;
a memory configured to store program instructions; and
a processor configured to execute the program instructions stored in the memory, the program instructions when executed configured to:
correct an output voltage of a current transformer (CT) sensor to be about equal to an output voltage value of a CT sensor at a pre-stored output voltage of the DC-DC converter;
calculate an input current value of the DC-DC converter in a current map using the corrected output voltage of the CT sensor, wherein the current map is a map that stores the relationship between the input voltage and input current of the DC-DC converter and the output voltage of the CT sensor; and
calculate the efficiency of the DC-DC converter in an efficiency map using the input current value, wherein the efficiency map 320 is obtained by previously and experimentally measuring the output voltage depending on the input voltage of the DC-DC converter.

7. The system of claim 6, wherein in calculating the input current value using the corrected output voltage of the CT sensor, a current value that corresponds to the corrected output voltage of the CT sensor in the current map and the input voltage of the DC-DC converter is calculated as the input current value.

8. The system of claim 6, wherein in calculating the efficiency of the DC-DC converter in the efficiency map using the input current value, the efficiency that depends on the input current value and the input voltage value of the DC-DC converter is selected.

9. The system of claim 6, wherein the program instructions when executed are further configured to:
correct the efficiency for each output voltage using the efficiency;
calculate an output power based on the corrected efficiency for each output voltage; and
calculate an output current based on the output power.

10. The system of claim 6, wherein the program instructions when executed are further configured to:
adjust an output voltage of a CT sensor of the DC-DC converter into a direct current waveform using a low pass filter prior to correcting the output voltage of the CT sensor;
calculate an input power value by multiplying the adjusted output voltage of the CT sensor by the input voltage of the DC-DC converter;
calculate an output power value by multiplying the input power value by the efficiency of the output power which depends on the input voltage; and
calculate an output current by dividing the output power value by the output voltage of the DC-DC converter.

11. A non-transitory computer readable medium containing program instructions executed by a processor, the computer readable medium comprising:
program instructions that correct an output voltage of a current transformer (CT) sensor to be about equal to an output voltage value of a CT sensor at a pre-stored output voltage of the DC-DC converter, the current transformer (CT) sensor being applied to input terminal of the DC-DC converter to sense current at the input terminal of the DC-DC converter;
program instructions that calculate an input current value of the DC-DC converter in a current map using the corrected output voltage of the CT sensor wherein the current map is a map that stores the relationship between the input voltage and input current of the DC-DC converter and the output voltage of the CT sensor; and
program instructions that calculate the efficiency of the DC-DC converter in an efficiency map using the input current value, wherein the efficiency map is 320 is obtained by previously and experimentally measuring and storing the output voltage depending on the voltage of the DC-DC converter.

12. The non-transitory computer readable medium of claim 11, wherein in calculating the input current value using the corrected output voltage of the CT sensor, a current value that corresponds to the corrected output voltage of the CT sensor in the current map and the input voltage of the DC-DC converter is calculated as the input current value.

13. The non-transitory computer readable medium of claim 11, wherein in calculating the efficiency of the DC-DC converter in the efficiency map using the input current value, the efficiency that depends on the input current value and the input voltage value of the DC-DC converter is selected.

14. The non-transitory computer readable medium of claim 11, further comprising:
    program instructions that correct the efficiency for each output voltage using the efficiency;
    program instructions that calculate an output power based on the corrected efficiency for each output voltage; and
    program instructions that calculate an output current based on the output power.

15. The non-transitory computer readable medium of claim 11, further comprising:
    program instructions that adjust an output voltage of a CT sensor of the DC-DC converter into a direct current waveform using a low pass filter prior to correcting the output voltage of the CT sensor;
    program instructions that calculate an input power value by multiplying the adjusted output voltage of the CT sensor by the input voltage of the DC-DC converter;
    program instructions that calculate an output power value by multiplying the input power value by the efficiency of the output power which depends on the input voltage; and
    program instructions that calculate an output current by dividing the output power value by the output voltage of the DC-DC converter.

* * * * *